United States Patent
Tobishima et al.

(10) Patent No.: US 12,391,870 B2
(45) Date of Patent: Aug. 19, 2025

(54) COATED SEMICONDUCTOR NANOPARTICLES AND METHOD FOR PRODUCING THE SAME

(71) Applicant: SHIN-ETSU CHEMICAL CO., LTD., Tokyo (JP)

(72) Inventors: Kazuya Tobishima, Annaka (JP); Shinji Aoki, Annaka (JP); Yoshihiro Nojima, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 314 days.

(21) Appl. No.: 17/923,940

(22) PCT Filed: Apr. 19, 2021

(86) PCT No.: PCT/JP2021/015838
§ 371 (c)(1),
(2) Date: Nov. 8, 2022

(87) PCT Pub. No.: WO2021/235152
PCT Pub. Date: Nov. 25, 2021

(65) Prior Publication Data
US 2023/0174851 A1    Jun. 8, 2023

(30) Foreign Application Priority Data
May 18, 2020  (JP) ................. 2020-086918

(51) Int. Cl.
| | | |
|---|---|---|
| C09K 11/02 | (2006.01) | |
| B82Y 20/00 | (2011.01) | |
| B82Y 40/00 | (2011.01) | |
| C08K 9/02 | (2006.01) | |
| C09K 11/08 | (2006.01) | |
| C09K 11/88 | (2006.01) | |
| H10H 20/851 | (2025.01) | |

(52) U.S. Cl.
CPC ............ C09K 11/025 (2013.01); C08K 9/02 (2013.01); C09K 11/0883 (2013.01); C09K 11/883 (2013.01); H10H 20/8512 (2025.01); B82Y 20/00 (2013.01); B82Y 40/00 (2013.01); C08K 2201/011 (2013.01)

(58) Field of Classification Search
CPC . C09K 11/025; C09K 11/0883; C09K 11/883; C08K 9/02; H10H 20/854; H10H 20/8512
See application file for complete search history.

(56) References Cited

U.S. PATENT DOCUMENTS

| | | | |
|---|---|---|---|
| 2011/0094416 A1* | 4/2011 | Kawai | ........................ C09C 3/12 204/157.43 |
| 2012/0301971 A1 | 11/2012 | Murase et al. | |
| 2017/0029697 A1 | 2/2017 | Ghosh et al. | |
| 2017/0306227 A1 | 10/2017 | Ippen et al. | |
| 2018/0301592 A1 | 10/2018 | Peng et al. | |
| 2019/0211260 A1 | 7/2019 | Won et al. | |

FOREIGN PATENT DOCUMENTS

| | | | |
|---|---|---|---|
| CN | 1693207 | A | 11/2005 |
| CN | 108475694 | A | 8/2018 |
| JP | 4403270 | B2 | 1/2010 |
| JP | 2012-022028 | A | 2/2012 |
| JP | 2017-025219 | A | 2/2017 |
| JP | 2018-534784 | A | 11/2018 |
| JP | 2019-123866 | A | 7/2019 |
| KR | 10-2017-0007641 | A | 1/2017 |
| WO | 2010/004814 | A1 | 1/2010 |
| WO | 2011/081037 | A1 | 7/2011 |
| WO | WO 2012/022155 | * | 2/2013 |

OTHER PUBLICATIONS

Mar. 7, 2023 Office Action issued in Japanese Patent Application No. 2020-086918.
Jul. 11, 2023 Office Action issued in Japanese Patent Application No. 2020-086918.
Jun. 29, 2021, International Search Report Issued in International Patent Application No. PCT/JP2021/015838.
Nov. 17, 2022, International Preliminary Report on Patentability Issued in International Patent Application No. PCT/JP2021/015838.
Nov. 1, 2024 Office Action issued in Chinese Patent Application No. 202180035580.6.
Dec. 18, 2024 Office Action issued in Korean Patent Application No. 10-2022-7038849.
Apr. 7, 2025 Office Action issued in Korean Patent Application No. 10-2022-7038849 (with partial translation).
Jun. 13, 2025 Office Action issued in Chinese Patent Application No. 202180035580.6.

* cited by examiner

*Primary Examiner* — C Melissa Koslow
(74) *Attorney, Agent, or Firm* — Oliff PLC

(57) ABSTRACT

A method for producing coated semiconductor nanoparticles, comprising a step of coating the surface of semiconductor nanoparticles with a metal oxide, wherein the surface of the semiconductor nanoparticles is coated with the metal oxide by treating a metal oxide precursor with microwave irradiation treatment.

15 Claims, No Drawings

COATED SEMICONDUCTOR NANOPARTICLES AND METHOD FOR PRODUCING THE SAME

TECHNICAL FIELD

The present invention relates to coated semiconductor nanoparticles and method for producing the same.

BACKGROUND ART

In semiconductor particles with nanosized particle diameters, excitons generated upon light absorption are confined in nanosized region, so that energy level of the semiconductor nanoparticles become discrete. Further, bond gap changes depending on the particle diameter. Due to these effects, the fluorescence emission by semiconductor nanoparticles is more efficient than those by common fluorescent materials and exhibits sharp light emission.

Moreover, based on such nature that the band gap varies depending on the particle diameter, semiconductor nanoparticles are characterized in that the emission wavelength is controllable and are expected to be applied as a wavelength conversion material for solid-state lighting and displays (Patent Document 1).

However, semiconductor nanoparticles tend to have defects such as dangling bonds on their surfaces. Oxidation reaction by oxygen or moisture progresses in these surface defects, and new defect levels are formed, so that fluorescence luminous efficiency deteriorates over time.

The fluorescence luminous efficiency of currently available semiconductor nanoparticles can be adversely affected by heat, humidity, photoexcitation, and particle-to-particle aggregation. Furthermore, it is known that depending on the application of wavelength conversion materials such as those used in displays, they are used by dispersing them in resins, etc., but semiconductor nanoparticles aggregate in resins and decrease in stability, resulting in a decrease in fluorescence luminous efficiency.

In view of the above, as a method for suppressing the deterioration of the fluorescence luminous efficiency of semiconductor nanoparticles, a technique has been proposed in which the surfaces of semiconductor nanoparticles are coated with a protective layer such as a metal oxide to improve stability.

For example, Patent Document 2 discloses a method for producing a composite in which semiconductor nanoparticles are dispersed in silica glass by reacting metal alkoxides stepwise on the surface of semiconductor nanoparticles to deposit a silica glass layer. It is disclosed that such a production method can provide composites containing semiconductor nanoparticles with high fluorescence luminous efficiency and stability.

However, when using the composite disclosed in Patent Document 2 as a wavelength conversion material, further improvement in fluorescence luminous efficiency was required. In terms of stability, it was also necessary to suppress deterioration of fluorescence luminous efficiency under high temperature and high humidity conditions in addition to room temperature atmospheric conditions.

Further, in Patent Document 3, by adding an aqueous dispersion solution of semiconductor nanoparticles to an organic solvent in which a surfactant is dissolved, reverse micelles encapsulating an aqueous solution of nanoparticles are formed, and glass composites in which nanoparticles are dispersed and fixed are produced by using the reverse micelles are used as reaction field of metal oxide precursors.

The method of Patent Document 3 can provide a glass composite exhibiting high fluorescence luminous efficiency. However, there are problems that mass production and cost reduction are difficult because this production method requires several days of reaction time and uses a large amount of solvent and surfactant.

CITATION LIST

Patent Literature

Patent Document 1: JP 2012-022028 A
Patent Document 2: WO 2011/081037 A1
Patent Document 3: Japanese Patent No. 4403270

SUMMARY OF INVENTION

Technical Problem

The present invention has been made to solve the above problems, and an object of the present invention is to provide a method for efficiently producing coated semiconductor nanoparticles in which deterioration in fluorescence luminous efficiency is suppressed. In addition, the present invention provides coated semiconductor nanoparticles in which deterioration in fluorescence luminous efficiency is suppressed.

Solution to Problem

The present invention has been made to achieve the above objects, and provides a method for producing coated semiconductor nanoparticles, comprising a step of coating the surface of semiconductor nanoparticles with a metal oxide, wherein the surface of the semiconductor nanoparticles is coated with the metal oxide by treating a metal oxide precursor with microwave irradiation treatment.

With such a method for producing coated semiconductor nanoparticles, it is possible to efficiently produce coated semiconductor nanoparticles in which deterioration in fluorescence luminous efficiency is suppressed.

At this time, it is preferable that the coating step is performed under the coexistence of the semiconductor nanoparticles and the metal oxide precursor, and the metal oxide precursor under the coexistence is subjected to the microwave irradiation treatment, so that the surface of the semiconductor nanoparticles is coated with the metal oxide.

As a result, the semiconductor nanoparticles can be reliably coated with the metal oxide, and the coated semiconductor nanoparticles in which deterioration in fluorescence luminous efficiency is more suppressed can be produced more efficiently.

At this time, it is preferable that the semiconductor nanoparticles used in the coating step comprises a semiconductor nanoparticle core and one or more semiconductor nanoparticle shells covering the semiconductor nanoparticle core.

As a result, semiconductor nanoparticles with excellent fluorescence luminous properties and stability can be efficiently produced.

At this time, the semiconductor nanoparticle core used in the coating step can be selected as single, multiple, alloy, or mixed crystal, from ZnS, ZnSe, ZnTe, CdS, CdSe, CdTe, AlN, AlP, AlAs, AlCb, GaN, CaP, CaAo, GaSb, InN, InP, InAs, InSb, $AgGaS_2$, $AgInS_2$, $AgGaSe_2$, $AgInSe_2$, $CuGaS_2$, $CuGaSe_2$, $CuInS_2$, $CuInS_2$, $ZnSiP_2$, $ZnGeP_2$, $CdSiP_2$ and $CdGeP_2$.

These compounds are excellent in fluorescence luminous properties and stability, and therefore can be suitably used for semiconductor nanoparticle cores. Among these compounds, ZnSe, ZnTe, CdSe, CdS and InP are particularly preferred from the viewpoint of fluorescence luminous properties and stability.

At this time, it is preferable that the semiconductor nanoparticle shell used in the coating step is selected as single, multiple, alloy, or mixed crystal, from ZnS, ZnSe, ZnTe, CdS, CdSe, CdTe, AlN, AlP, AlAs, AlSb, GaN, Gap, GaAs, GaSb, InN, InP, InAs, InSb.

By doing so, semiconductor nanoparticles having a large bandgap and low lattice mismatch with respect to the core material can be obtained. Among these compounds, ZnSe, ZnS, CdSe, and CdS are particularly preferred from the viewpoint of improvement in fluorescence luminous efficiency and stability.

At this time, it is preferable that the coating step is performed in one or more solvents selected from a polar solvent, a nonpolar solvent, and an ionic liquid.

These solvents can be suitably used as dispersion media for semiconductor nanoparticles and metal oxide precursors.

At this time, it is preferable that the solvent used in the coating step contains at least 90% by volume of the nonpolar solvent.

By doing so, it is possible to more effectively suppress the deterioration of fluorescence luminous efficiency during coating.

At this time, it is preferable that the nonpolar solvent used in the coating step is one or more of toluene, hexane, cyclohexane, benzene, and diethyl ether.

These nonpolar solvents can further improve the dispersibility of the semiconductor nanoparticles.

At this time, it is preferable that the metal oxide precursor used in the coating step is one or more selected from metal alkoxides, metal halides, and metal complexes.

These metal oxide precursors are highly reactive and can foe suitably used for coating the surfaces of semiconductor nanoparticles as metal oxides.

At this time, it is preferable that the coating step is performed in the presence of an alkaline aqueous solution.

This makes it easier to control the film thickness of the coating layer.

At this time, it is preferable that the coating step is performed in the presence of a surfactant.

By doing so, the dispersibility of the metal oxide precursor becomes excellent.

At this time, it is preferable that the coating step is performed in the presence of alcohol.

By doing so, the dispersibility of the metal oxide precursor becomes more excellent.

Further, the treatment time of the microwave irradiation treatment in the coating step is preferably in a range of 3 to 30 minutes, more preferably in a range of 5 to 15 minutes.

With such a treatment time, it is possible to more effectively prevent a decrease in fluorescence luminous efficiency.

Also, the heating temperature of the microwave irradiation treatment in the coating step is preferably in a range of 40 to 100° C., more preferably in a range of 50 to 80° C.

Although the reaction temperature in the microwave irradiation treatment varies depending on the solvent, such a temperature can more effectively prevent deterioration of fluorescence luminous efficiency.

At this time, it is preferable to include modifying step the surface of the semiconductor nanoparticles with a surface modifier before the coating step.

By doing so, the metal oxide precursor reacts on the surface of the semiconductor nanoparticles via the surface modifier, so that the surface of the semiconductor nanoparticles is coated with the metal oxide layer more efficiently, and deterioration of fluorescence luminous efficiency is suppressed during the microwave irradiation treatment.

At this time, the surface modifier is preferably one or more selected from (3-aminopropyl) trimethoxysilane, (3-aminopropyl) triethoxysilane, (3-mercaptopropyl) trimethoxysilane, (3-mercaptopropyl) triethoxysilane, 6-mercapto-1-hexanol, mercaptoacetic acid, 3-mercaptopropionic acid, and 4-mercaptobenzoic acid.

These compounds can be suitably used as surface modifiers.

In addition, the present invention provides a coated semiconductor nanoparticle in which the surface of the semiconductor nanoparticle is coated with a metal oxide, wherein the metal oxide is obtained by coating the surface of the semiconductor nanoparticles with a microwave irradiation treatment.

Such coated semiconductor nanoparticles have suppressed deterioration in fluorescence luminous efficiency.

At this time, it is preferable to form a resin composition in which coating semiconductor nanoparticles are dispersed in a resin.

Such a resin composition is a resin composition in which deterioration of fluorescence luminous efficiency is suppressed.

At this time, it is preferable to form a wavelength conversion material using a cured product of the resin composition.

Such a wavelength conversion material has improved reliability.

At this time, it is preferable to form a light emitting device using a wavelength conversion material.

Such a light emitting device has particularly excellent reliability.

Advantageous Effects of Invention

As described above, according to the method for producing coated semiconductor nanoparticles of the present invention, it is possible to efficiently produce coated semiconductor nanoparticles in which deterioration in fluorescence luminous efficiency is suppressed. In addition, the coated semiconductor nanoparticles of the present invention are coated semiconductor nanoparticles in which deterioration in fluorescence luminous efficiency is suppressed. Moreover, the coated semiconductor nanoparticles of the present invention can be suitably used for a resin composition, a wavelength conversion material using a cured product of the resin composition, and a light emitting device using the wavelength conversion material.

DESCRIPTION OF EMBODIMENTS

Embodiments of the present invention will be described below. However, in the present invention, the composition and production method of the semiconductor nanoparticles and metal oxide are not limited to the following embodiments.

As described above, there is a problem of efficiently producing semiconductor nanoparticles in which deterioration of fluorescence luminous efficiency is suppressed. The inventors of the present invention have extensively studied the above problems and found that by a method for producing coated semiconductor nanoparticles, comprising a step of coating the surface of semiconductor nanoparticles with a metal oxide, wherein the step of coating is performed with microwave irradiation treatment, semiconductor nanoparticles in which deterioration in fluorescence luminous efficiency is suppressed can be produced efficiently, and have completed the present invention.

That is, the present invention is a method for producing coated semiconductor nanoparticles, comprising a step of coating the surface of semiconductor nanoparticles with a metal oxide, wherein the surface of the semiconductor nanoparticles is coated with the metal oxide by treating a metal oxide precursor with microwave irradiation treatment.

The inventors of the present; invention presume the mechanism by which the above problems are solved as follows.

In the method of coating metal oxide on the surface of semiconductor nanoparticles using the Stover method or the reverse micelle method, since the semiconductor nanoparticles coexist with water and oxygen for a long time, the oxidation reaction of the particle surface and the desorption of ligands cause particles to interact with each other, aggregation occurs, and fluorescence luminous efficiency gradually deteriorates.

On the other hand, in the method using microwave irradiation treatment, the metal oxide precursor is selectively and directly heated from the inside, and the reaction proceeds in a short time. Therefore, metal oxide coating proceeds efficiently under mild conditions, desorption of ligands adsorbed on the surface of semiconductor nanoparticles (quantum dots) and surface oxidation reactions are alleviated, and deterioration of fluorescence luminous efficiency is suppressed.

Therefore, by subjecting the metal oxide precursor to microwave irradiation treatment and coating the surface of the semiconductor nanoparticles with the metal oxide, it becomes possible that the desorption of the ligands and the surface oxidation reaction are alleviated, and the deterioration of the fluorescence luminous efficiency is suppressed.

The above mechanism is based on speculation, and its correctness or wrongness does not affect the technical scope of the present invention.

(Semiconductor Nanoparticles)

Although the structure of the semiconductor nanoparticles in the present invention is not particularly limited, semiconductor nanoparticles with a core/shell structure are preferable from the viewpoint of fluorescence luminous properties and stability. That is, it preferably includes a semiconductor nanoparticle core and one or more semiconductor nanoparticle shells covering the semiconductor nanoparticle core. In semiconductor nanoparticles with a core/shell structure, in which a nanosized semiconductor particle is used as the core and a semiconductor with a larger bandgap than the core and low lattice mismatch is used as the shell, excitons generated in the shell are confined in the core particle. Due to the internal confinement, the fluorescence luminous efficiency is improved, and the core surface is covered with the shell, which improves the stability.

The material of the semiconductor nanoparticle core of the core/shell semiconductor nanoparticles is not particularly limited, but it is preferable to use compounds selected as single, multiple, alloy, or mixed crystal, from II-VI group compounds, III-V group compounds, I-III-VI group compounds, and II-IV-V group compounds.

As specific core materials, compounds including ZnS, ZnSe, ZnTe, CdS, CdSe, CdTe, AlN, AlP, AlAs, AlSb, GaN, GaP, GaAs, GaSb, InN, InP, InAs, InSb, AgGaS$_2$, AgInS$_2$, AgGaSe$_2$, AgInSe$_2$, CuGaS$_2$, CuGaSe$_2$, CuInS$_2$, CuInS$_2$, ZnSiP$_2$, ZnGeP$_2$, CdSi$_2$, CdGeP$_2$ can be mentioned. Since these compounds are excellent in fluorescence luminous properties and stability, they can be suitably used for semiconductor nanoparticle cores. Among these compounds, ZnSe, ZnTe, CdSe, CdS, and InP, it is particularly preferable from the viewpoint of fluorescence luminous properties and stability.

The material for the semiconductor nanoparticle shell is not particularly limited, but preferably has a large bandgap and low lattice mismatch with respect to the core material. It is preferable to use compounds selected as single, multiple, alloy, or mixed crystal, from, II-VI group compounds and III-V group compounds.

As specific shell compounds, the compounds including ZnS, ZnSe, ZnTe, CdS, CdSe, CdTe, AlN, AlP, AlAs, AlSb, GaN, GaP, GaAs, GaSb, InN, InP, InAs, and InSb can be mentioned and these can have a large bandgap and a low lattice mismatch with respect to the core material. Among these compounds, ZnSe, ZnS, CdSe, and CdS are particularly preferred from the viewpoint of improvement in fluorescence luminous efficiency and stability.

There are various methods for producing semiconductor nanoparticles, such as a liquid phase method and a vapor phase method, but the method is not particularly limited in the present invention. From the viewpoint of exhibiting high fluorescence luminous efficiency, it is preferable to use semiconductor nanoparticles obtained by using a hot soap method or a hot injection method, in which precursor species are reacted at high temperature in a nonpolar solvent with a high boiling point.

In order to reduce surface defects, the semiconductor nanoparticles preferably have organic ligands called ligands coordinated to their surfaces. The ligand preferably contains an aliphatic hydrocarbon from the viewpoint of suppressing aggregation of semiconductor nanoparticles. As examples of such ligands, oleic acid, stearic acid, palmitic acid, myristic acid, lauric acid, decanoic acid, octanoic acid, oleylamine, stearyl(octadecyl)amine, dodecyl(lauryl)amine, decylamine, octylamine, octadecane thiol, hexadecanethiol, tetradecanethiol, dodecanethiol, decanethiol, octanethiol, trioctylphosphine, trioctylphosphine oxide, triphenylphosphine, triphenylphosphine oxide, tributylphosphine, tributylphosphine oxide, or the like can be mentioned, and one of these may be used alone or in combination.

(Coated Semiconductor Nanoparticles)

In the method for producing coated semiconductor nanoparticles of the present invention, the surface of the semiconductor nanoparticles is coated with the metal oxide by irradiating the metal oxide precursor with microwave. By using microwaves, the metal oxide precursor is directly heated from the inside, and the coating proceeds selectively in a shorter time.

As used herein, "microwave" generally refer to electromagnetic waves having a frequency of 300 MHz to 3 THz. In addition, examples of the microwave irradiation method include, but are not limited to, a method using flexi WAVE manufactured by Milestone.

In addition, in the present invention, silicon oxide is included in metal oxide.

The "coating" of the metal oxide on the surface of the semiconductor particles in the method for producing coated semiconductor nanoparticles of the present invention may be in the form of partial or complete coating. Further, it may be a uniform coating layer such as a core/shell structure, a non-uniform coating layer, or a structure in which a plurality of semiconductor nanoparticles are coated with a metal oxide. Although the film thickness of the metal oxide is not particularly limited, it is preferably 100 nm or less from the viewpoint of translucency.

At this time, the coating step is performed under the coexistence of the semiconductor nanoparticles and the metal oxide precursor, and the metal oxide precursor in the coexistence is preferably irradiated with microwaves to coat the surface of the semiconductor nanoparticles with the metal oxide. As a result, the semiconductor nanoparticles can be reliably coated with the metal oxide, and the coated semiconductor nanoparticles in which deterioration in fluorescence luminous efficiency is more suppressed can be produced more efficiently.

At this time, as the dispersion medium for the semiconductor nanoparticles and the metal oxide precursor in the coating step, it is preferable to select one or more of a polar solvent, a nonpolar solvent, and an ionic liquid, and to perform coating in that solvent. These solvents can be suitably used as dispersion media for semi conductor nanoparticles and metal oxide precursors.

At this time, it is preferable that the ratio of the nonpolar solvent in the solvent is 90% or more by volume. With such a solvent, it is possible to suppress the deterioration of fluorescence luminous efficiency during coating.

Moreover, it is preferable that the nonpolar solvent used in the coating step is one or more of toluene, hexane, cyclohexane, benzene, and diethyl ether. These nonpolar solvents can further improve the dispersibility of the semiconductor nanoparticles. Also, if the solvent is a nonpolar solvent, a microwave absorbing heating element, called a weflon, may optionally be used during the coating process.

Although the metal oxide precursor is not particularly limited, it is preferable to use one or more selected from metal alkoxides, metal halides, and metal complexes. These metal oxide precursors are highly reactive and suitable for coating the surfaces of semiconductor nanoparticles as metal oxides.

As examples of metal alkoxide compounds, tetramethyl orthosilicate, tetraethyl orthosilicate, tetrapropyl orthosilicate, tetraisopropyl orthosilicate, tetrabutyl orthosilicate, tetrakis(2-ethylhexyloxy) silane, trimethoxysilane, triethoxysilane, (3-aminopropyl) trimethoxysilane, (3-aminopropyl) triethoxysilane, (3-mercaptopropyl) trimethoxysilane, (3-mercaptopropyl) triethoxysilane, titanium ethoxide, titanium tetraisopropoxide, titanium tetra butoxide, titanium tetraisobutoxide, tetrakis(2-ethylhexyl) orthotitanate, zinc isopropoxide, zinc tert-butoxide, zirconium ethoxide, zirconium propoxide, zirconium butoxide, aluminum ethoxide, aluminum isopropoxide, aluminum tert-butoxide, aluminum sec-butoxide, yttrium isopropoxide, hafnium ethoxide, hafnium tert-butoxide, iron ethoxide, iron isopropoxide can be mentioned.

Further, as metal halide compounds, titanium chloride, zinc chloride, silicon tetrachloride, zirconium chloride, aluminum chloride, yttrium chloride, iron (IT) chloride, iron (III) chloride, titanium bromide, zinc bromide, zirconium bromide, hafnium bromide, aluminum bromide, yttrium bromide, iron (II) bromide, iron (III) bromide, titanium iodide, zinc iodide, silicon tetraiodide, zirconium iodide, hafnium iodide, aluminum iodide, yttrium iodide, iron (II) iodide, iron (III) iodide, or the like can be mentioned.

Further, as examples of metal complex compounds, aluminum acetylacetonate, titanyl acetylacetonate, iron (III) acetylacetonate, zinc acetylacetonate, and zirconium acetylacetonate, or the like can be mentioned.

From the viewpoint of stability, preferred metal oxide precursors are silicon alkoxide, aluminum alkoxide zirconium alkoxide, and titanium alkoxide. The mixing ratio (weight ratio) of the semiconductor nanoparticles and the metal oxide precursor is preferably 1:0.4 to 1:3.

At this time, it is desirable to use a catalyst to accelerate the reaction of the metal oxide precursor during the coating process. In particular, when using a metal alkoxide, it is desirable to use a catalyst to promote the sol-gel reaction. As the catalyst, an acidic aqueous solution or a basic aqueous solution can be mentioned and the basic aqueous solution is particularly preferable from the viewpoint of the film thickness of the coating layer. The mixing ratio (molar ratio) of the catalyst and the metal oxide precursor is preferably 1:0.4 to 1:2, and the mixing ratio (molar ratio) of the metal oxide precursor and water is preferably 1:2 to 1:10.

In addition, it is preferable to use a surfactant in the coating process from the viewpoint of the dispersibility of the metal oxide precursor. Surfactants are not particularly limited, but for example, cationic surfactants such as quaternary ammonium salts such as cetyltrimethylammonium bromide, anionic surfactants such as carboxylates and sulfonates, and nonionic surfactants such as polyoxyethylene alkyl ether can be mentioned. Cationic surfactants are particularly preferred from the viewpoint of metal oxide precursor dispersibility. The surfactant may be added as it is, or may be dissolved in a polar solvent such as alcohol, which will be described later, and added as a solution.

Moreover, it is preferable to perform a coating process in alcohol presence. If the coating is performed in the presence of alcohol, the dispersibility of the metal oxide precursor becomes better. Further, when a surfactant is added, dispersibility can be further improved by dissolving it in a polar solvent such as alcohol.

Moreover, it is preferable to include a step of modifying the surface of the semiconductor nanoparticles with a surface modifier before the coating step. In this modification step, the metal oxide precursor reacts on the surface of the semiconductor nanoparticles via the surface modifier, so that the surface of the semiconductor nanoparticles is coated with the metal oxide layer more efficiently, and deterioration of fluorescence luminous efficiency is suppressed during the microwave irradiation treatment.

The surface modifier is preferably a compound that contains such as SH group, an $NH_2$ group, and the like that is a substituent that adsorbs to the surface of the semiconductor nanocrystal particle at one end of the molecule, and such as a $-Si(OR)_3$ group (R: an alkyl group having 4 or less carbon atoms), OH group, COOH group, and the like that is a substituent that reacts with the metal oxide precursor at the other end. As the surface modifier, (3-aminopropyl) trimethoxysilane, (3-aminopropyl) triethoxysilane, (3-mercaptopropyl) trimethoxysilane, (3-mercaptopropyl) triethoxysilane, 6-mercapto-1-hexanol, mercaptoacetic acid, 3-mercaptopropionic acid, and 4-mercaptobenzoic acid, can be mentioned. The surface modifier may be used singly or in combination. The atmosphere during modification with the surface modifier is not particularly limited, and the modification is performed, for example, in an atmosphere of an inert gas such as nitrogen.

At this time, the reaction temperature in the microwave irradiation treatment varies depending on the solvent, but is preferably 40 to 100° C., more preferably 50 to 80° C., from the viewpoint of preventing deterioration of fluorescence luminous efficiency.

At this time, the treatment time in the microwave irradiation treatment is desirably 3 to 30 minutes, more preferably 5 to 15 minutes, from the viewpoint of preventing deterioration in fluorescence luminous efficiency.

In addition, the present invention provides a coated semiconductor nanoparticle in which the surface of the semiconductor nanoparticle is coated with a metal oxide, wherein the metal oxide is obtained by coating the surface of the semiconductor nanoparticles with a microwave irradiation treatment.

The coated semiconductor nanoparticles of the present invention are obtained by coating the surface of semiconductor nanoparticles with a metal oxide by microwave treatment. Such coated semiconductor nanoparticles of the present invention have suppressed deterioration in fluorescence luminous efficiency. Examples of semiconductor nanoparticles and metal oxides include the above described semiconductor nanoparticles and metal oxides.

The microwave irradiation treatment coating of the present invention is to coat the surface of semiconductor nanoparticles with a metal oxide irradiated with microwaves. Microwave is as described above.

Moreover, it is preferable to use the coated semiconductor nanoparticles as a resin composition dispersed in a resin. By doing so, it is possible to obtain a resin composition in which deterioration in fluorescence luminous efficiency is suppressed.

Although the resin material is not particularly limited, it is preferable that the coated semiconductor nanoparticles do not aggregate and the fluorescence luminous efficiency does not deteriorate. As examples thereof, silicone resin, acrylic resin, epoxy resin, urethane resin, fluororesin or the like can be mentioned. These materials preferably have a high transmittance, particularly preferably a transmittance of 80% or more, in order to increase fluorescence luminous efficiency as a wavelength conversion material.

Moreover, it is preferable that the wavelength conversion material uses a cured product of the above resin composition. Such a wavelength conversion material has improved reliability. The wavelength conversion material may be used as is or processed. For example, as one form, there is a wavelength conversion film in which the composite is dispersed in the resin by processing it into a sheet and then curing it.

Although the method for producing the wavelength conversion material is not particularly limited, it can be obtained by, for example, a resin composition in which coating semiconductor nanoparticles are dispersed in a resin is coated on a transparent film such as PET or polyimide, cured, and laminated to form a wavelength conversion material.

Application to the transparent film can be carried out by atomization methods such as spraying and ink-jetting, spin coating, bar coater, or doctor blade method, and a resin layer is formed by the application. Moreover, the thickness of the resin layer and the transparent film is not particularly limited and can be appropriately selected according to the application.

Although the method for curing the resin composition is not particularly limited, for example, the film coated with the resin composition may be heated at 60° C. for 2 hours and then at 150° C. for 4 hours.

Furthermore, it is preferable to use the wavelength conversion material as a light emitting device. Light emitting devices are not; particularly limited, but light emitting diodes or the like can be mentioned. The light emitting device using such a wavelength conversion material has particularly excellent reliability.

EXAMPLE

The present invention will be specifically described below using Examples and Comparative Examples, but the present invention is not limited to these.

(Evaluation of Luminous Characteristics)

In Examples and Comparative Examples, as evaluation of fluorescence luminous characteristics of semiconductor nanoparticles, fluorescence luminous efficiency (internal quantum efficiency) at an excitation wavelength of 450 nm were measured using a quantum efficiency measurement system (QE-2100) manufactured by Otsuka Electronics Co., Ltd.

(Production of Semiconductor Nanoparticles)

Manufacturing Example 1

In a flask, 0.070 g (0.24 mmol) of indium acetate, 0.256 g (0.72 mmol) of palmitic acid, and 4.0 mL of 1-octadecene were added, and heated and stirred at 100° C. under reduced pressure to dissolve and degassing was performed for one hour. After cooling the flask to room temperature, it was purged with nitrogen and 0.50 mL (0.17 mmol) of 10 vol % (tris) trimethylsilyl-phosphine/octadecene solution was added to the flask. InP semiconductor core particles were synthesized by heating the flask to 300° C. and stirring for 20 minutes.

Next, after cooling the flask to 200° C., 4.0 mL (1.2 mmol) of 0.30 M zinc stearate/octadecene solution was added and stirred for 30 minutes. Additionally, 0.60 mL (0.90 mmol) of 1.5 M selenium/trioctylphosphine solution was added to the flask and stirred for 30 minutes. Next, after cooling the flask to room temperature, 0.22 g (1.1 mmol) of zinc acetate was added, heated and stirred at 100° C. under reduced pressure, and degassed for 1 hour while dissolving. After purging the flask with nitrogen, it was heated to 230° C., 0.48 mL (2.0 mmol) of 1-DDT (dodecanethiol) was added, and the mixture was stirred for 30 minutes.

The resulting solution was cooled to room temperature, ethanol was added, and centrifuged to precipitate the semiconductor nanoparticles and remove the supernatant. Further, toluene was added to the precipitate to disperse it, ethanol was added again, centrifugal separation was performed, the supernatant was removed, and the precipitate was re-dispersed in toluene to prepare a toluene solution of InP/ZnSe/ZnS semiconductor nanoparticles. The fluorescence luminous efficiency of the solution was 76%.

Manufacturing Example 2

In a flask, 0.070 g (0.24 mmol) of indium acetate, 0.256 g (0.72 mmol) of palmitic acid, and 4.0 mL of 1-octadecene were added, and heated and stirred at 100° C. under reduced pressure to dissolve and degassing was performed for one hour. After cooling the flask to room temperature, it was purged with nitrogen and 0.50 mL (0.17 mmol) of a 10 vol % (tris)trimethylsilyl-phosphine/octadecene solution was added to the flask. InP semiconductor core particles were synthesized by heating the flask to 300° C. and stirring for 20 minutes.

Next, after cooling the flask to 200° C., 4.0 mL (1.2 mmol) of 0.30 M zinc stearate/octadecene solution was added and stirred for 30 minutes. Additionally, 0.60 mL (0.90 mmol) of 1.5 M selenium/trioctylphosphine solution was added to the flask and stirred for 30 minutes. Next, after cooling the flask to room temperature, 0.22 g (1.1 mmol) of zinc acetate was added, heated and stirred at 100° C. under reduced pressure, and degassed for 1 hour while dissolving. After purging the flask with nitrogen, it was heated to 230° C., 0.48 mL (2.0 mmol) of 1-DDT was added, and the mixture was stirred for 30 minutes. Further, 0.70 mL (3.0 mmol) of (3-aminopropyl) triethoxysilane was added to the flask and stirred for 30 minutes.

The resulting solution was cooled to room temperature, ethanol was added, and centrifuged to precipitate the semiconductor nanoparticles and remove the supernatant. Further, toluene was added to the precipitate to disperse it, ethanol was added again, centrifugal separation was performed, the supernatant was removed, and the precipitate was re-dispersed in toluene to prepare a toluene solution of InP/ZnSe/ZnS semiconductor nanoparticles. The fluorescence luminous efficiency of the solution was 75%.

Manufacturing Example 3

In a flask, 0.070 g (0.24 mmol) of indium acetate, 0.256 g (0.72 mmol) of palmitic acid, and 4.0 mL of 1-octadecene were added, and heated and stirred at 100° C. under reduced pressure to dissolve and degassing was performed for one hour. After cooling the flask to room temperature, it was purged with nitrogen and 0.50 mL (0.17 mmol) of a 10 vol % (tris) trimethylsilyl-phosphine/octadecene solution was added to the flask. InP semiconductor core particles were synthesized by heating the flask to 300° C. and stirring for 20 minutes.

After cooling the flask to 200° C., 4.0 mL (1.2 mmol) of 0.30 M zinc stearate/octadecene solution was added and stirred for 30 minutes. Additionally, 0.60 mL (0.90 mmol) of 1.5 M selenium/trioctylphosphine solution was added to the flask and stirred for 30 minutes. Next, after cooling the flask to room temperature, 0.22 g (1.1 mmol) of zinc acetate was added, heated and stirred at 100° C. under reduced pressure, and degassed for 1 hour while dissolving. After purging the flask with nitrogen, it was heated to 230° C., 0.48 mL (2.0 mmol) of 1-DDT was added, and the mixture was stirred for 30 minutes. Further, 0.72 mL (3.0 mmol) of (3-mercaptopropyl) triethoxysilane was added to the flask and stirred for 30 minutes.

The resulting solution was cooled to room temperature, ethanol was added, and centrifuged to precipitate the semiconductor nanoparticles and remove the supernatant. Further, toluene was added to the precipitate to disperse it, ethanol was added again, centrifugal separation was performed, the supernatant was removed, and the precipitate was re-dispersed in toluene to prepare a toluene solution of InP/ZnSe/ZnS semiconductor nanoparticles. The fluorescence luminous efficiency of the solution was 74%.

Manufacturing Example 4

In a flask, 0.070 g (0.24 mmol) of indium acetate, 0.256 g (0.72 mmol) of palmitic acid, and 4.0 ml of 1-octadecene were added, and heated and stirred at 100° C. under reduced pressure to dissolve and degassing was performed for one hour. After cooling the flask to room temperature, it was purged with nitrogen and 0.50 mL (0.17 mmol) of a 10 vol % (tris) trimethylsilyl-phosphine/octadecene solution was added to the flask. InP semiconductor core particles were synthesized by heating the flask to 300° C. and stirring for 20 minutes.

After cooling the flask to 200° C., 4.0 mL (1.2 mmol) of 0.30 M zinc stearate/octadecene solution was added and stirred for 30 minutes. Additionally, 0.60 mL (0.90 mmol) of 1.5 M selenium/trioctylphosphine solution was added to the flask and stirred for 30 minutes. Next, after cooling the flask to room temperature, 0.22 g (1.1 mmol) of zinc acetate was added, heated and stirred at 100° C. under reduced pressure, and degassed for 1 hour while dissolving. After purging the flask with nitrogen, it was heated to 230° C., 0.48 mL (2.0 mmol) of 1-DDT was added, and the mixture was stirred for 30 minutes. Further, 0.35 mL (1.5 mmol) of (3-aminopropyl) triethoxysilane and 0.36 mL (1.5 mmol) of (3-mercaptopropyl)triethoxysilane were added to the flask and stirred for 30 minutes.

The resulting solution was cooled to room temperature, ethanol was added, and centrifuged to precipitate the semiconductor nanoparticles and remove the supernatant. Further, toluene was added to the precipitate to disperse it, ethanol was added again, centrifugal separation was performed, the supernatant was removed, and the precipitate was re-dispersed in toluene to prepare a toluene solution of InP/ZnSe/ZnS semiconductor nanoparticles. The fluorescence luminous efficiency of the solution was 74%.

The above Production Examples 1 to 4 are summarized in Table 1.

TABLE 1

| | Nanoparticles | Core | Shell | Surface modifier | Fluorescence luminous efficiency [%] |
|---|---|---|---|---|---|
| Manufacturing example 1 | InP/ZnSe/ZnS | InP | ZnSe/ZnS | — | 76 |
| Manufacturing example 2 | InP/ZnSe/ZnS | InP | ZnSe/ZnS | (3-aminopropyl) triethoxysilane | 75 |
| Manufacturing example 3 | InP/ZnSe/ZnS | InP | ZnSe/ZnS | (3-mercaptopropyl) triethoxysilane | 74 |
| Manufacturing example 4 | InP/ZnSe/ZnS | InP | ZnSe/ZnS | (3-aminopropyl) triethoxysilane and (3-mercaptopropyl) triethoxysilane | 74 |

(Production of Coated Semiconductor Nanoparticles)

Using the semiconductor nanoparticles produced in Production Examples 1 to 4, the method for producing coated semiconductor nanoparticles of the present invention was carried out. In addition, microwave irradiation was performed using a microwave synthesis reactor (flexi WAVE manufactured by Milestone General Co., Ltd.).

Example 1

10 g of the 1.0 wt % InP/ZnSe/ZnS semiconductor nanoparticle toluene solution obtained in Production Example 1, 100 μL of tetraethyl orthosilicate, and 50 μL of a 25% ammonia ($NH_3$) aqueous solution were mixed and added to a high pressure reaction vessel. The respective mixing ratios were semiconductor nanoparticles:tetraethyl, orthosilicate (weight ratio)=1:0.94, $NH_3$:tetraethyl orthosilicate (molar ratio)=1:0.39, tetraethyl orthosilicate (molar ratio):$H_2O$=1:4.6. After that, using the microwave synthesis reactor described above, heating was performed at 60° C. for 10 minutes at 2450 MHz to perform metal oxide coating. The resulting coated semiconductor nanoparticles were sedimented by centrifugation, the supernatant was removed, toluene was added, and the particles were re-dispersed by ultrasonic irradiation. The resulting coated semiconductor nanoparticles had a fluorescence luminous efficiency of 72%. The reduction rate of fluorescence luminous efficiency compared to before the coating process was 5.3%.

Example 2

10 g of the 1.0 wt % InP/ZnSe/ZnS semiconductor nanoparticle toluene solution obtained in Production Example 1, 100 μL of tetraethyl orthosilicate, 50 μL of a 25% aqueous ammonia solution, and 0.010 g of cetyltrimethylammonium bromide were mixed and added to the high pressure reaction vessel. The mixing ratios were semiconductor nanoparticles:tetraethyl orthosilicate (weight ratio) =1:0.94, $NH_3$:tetraethyl orthosilicate (molar ratio)=1:0.89, tetraethyl orthosilicate (molar ratio):$H_2O$=1:4.6. After that, using the microwave synthesis reactor described above, heating was performed at 60° C. for 10 minutes at 2450 MHz to perform metal oxide coating. The resulting coated semiconductor nanoparticles were sedimented by centrifugation, the supernatant was removed, toluene was added, and the particles were re-dispersed by ultrasonic irradiation. The fluorescence luminous efficiency of the resulting coated semiconductor nanoparticles was 70%, and the reduction rate of the fluorescence luminous efficiency compared to before the coating process was 7.9%.

Example 3

10 g of the 1.0 wt % InP/ZnSe/ZnS semiconductor nanoparticle toluene solution obtained in Production Example 1, 100 μL of tetraethylorthosilicate, 50 μL of a 25% aqueous ammonia solution, and 0.010 g/100 μL of the cetyltrimethylairuuonium bromide/ethanol solution were mixed and added to the high pressure reaction vessel. The mixing ratios were semiconductor nanoparticles:tetraethyl orthosilicate (weight ratio)=1:0.94, $NH_3$:tetraethyl orthosilicate (molar ratio)=1:0.89, tetraethyl orthosilicate (molar ratio):$H_2O$=1:4.6. After that, using the microwave synthesis reactor described above, heating was performed at 60° C. for 10 minutes at 2450 MHz to perform metal oxide coating. The resulting coated semiconductor nanoparticles were sedimented by centrifugation, the supernatant was removed, toluene was added, and the particles were re-dispersed by ultrasonic irradiation. The fluorescence luminous efficiency of the resulting coated semiconductor nanoparticles was 70%, and the reduction rate of the fluorescence luminous efficiency compared to before the coating process was 7.9%.

Example 4

10 g of the 1.0 wt % InP/ZnSe/ZnS semiconductor nanoparticle toluene solution obtained in Production Example 1, 0.092 g of aluminum isopropoxide, 50 μL of a 25% aqueous ammonia solution, and 0.010 g/100 μL of the cetyltrimethylammonium bromide/ethanol solution were mixed and added to the high pressure reaction vessel. The respective mixing ratios are semiconductor nanoparticles: aluminum isopropoxide (weight ratio)=1:0.92, $NH_3$:aluminum isopropoxide (molar ratio)=1:0.89, and aluminum isopropoxide (molar ratio):$H_2O$=1:4.6. After that, using the microwave synthesis reactor described above, heating was performed at 60° C. for 10 minutes at 2450 MHz to perform metal oxide coating. The resulting coated semiconductor nanoparticles were sedimented by centrifugation, the supernatant was removed, toluene was added, and the particles were re-dispersed by ultrasonic irradiation. The fluorescence luminous efficiency of the resulting coated semiconductor nanoparticles was 68%, and the reduction rate of the fluorescence luminous efficiency compared to before the coating process was 10.5%.

Example 5

10 g of the 1.0 wt % InP/ZnSe/ZnS semiconductor nanoparticle toluene solution obtained in Production Example 1, 0.153 g of titanium tetrabutoxide, 50 μL of 25% aqueous ammonia solution, and 0.010 g/100 μL of the cetyltrimethylammonium bromide/ethanol, solution were mixed and added to the high pressure reaction vessel. The respective mixing ratios were semiconductor nanoparticles: titanium tetrabutoxide (weight ratio)=1:1.5, $NH_3$:titanium tetrabutoxide (molar ratio)=1:0.89, titanium tetrabutoxide (molar ratio):$H_2O$=1:4.6. After that, using the microwave synthesis reactor described above, heating was performed at 60° C. for 10 minutes at 2450 MHz to perform metal oxide coating. The resulting coated semiconductor nanoparticles were sedimented by centrifugation, the supernatant was removed, toluene was added, and the particles were re-dispersed by ultrasonic irradiation. The fluorescence luminous efficiency of the resulting coated semiconductor nanoparticles was 65%, and the reduction rate of the fluorescence luminous efficiency compared to before the coating process was 14.5%.

Example 6

10 g of the 1.0 wt % InP/ZnSe/ZnS semiconductor nanoparticle toluene solution obtained in Production Example 1, 0.147 g of zirconium propoxide, 50 μL of a 25% aqueous ammonia solution, and 0.010 g/100 μL of the cetyltrimethylammonium bromide/ethanol solution were mixed and added to the high pressure reaction vessel. The respective mixing ratios were semiconductor nanoparticles: zirconium propoxide (weight ratio)=1:1.5, $NH_3$:zirconium propoxide (molar ratio)=1:0.89, zirconium propoxide:$H_2O$ (molar ratio)=1:4.6. After that, using the microwave synthesis reactor described above, heating was performed at 60° C. for 10 minutes at 2450 MHz to perform metal oxide coating. The resulting coated semiconductor nanoparticles were sedimented by centrifugation, the supernatant was removed, toluene was added, and the particles were re-dispersed by ultrasonic irradiation. The fluorescence luminous efficiency of the resulting coated semiconductor nanoparticles was 67%, and the redaction rate of the fluorescence luminous efficiency before the coating process was 11.8%.

Example 7

10 g of the 1.0 wt % InP/ZnSe/ZnS semiconductor nanoparticle toluene solution obtained in Production Example 1, 50 μL of tetraethylorthosilicate, 50 μL of a 25% aqueous ammonia solution, and 0.010 g/100 μL of the cetyltrimethylammonium bromide/ethanol solution were mixed and added to the high pressure reaction vessel. At this time, the mixing ratios were semiconductor nanoparticles:

tetraethyl orthosilicate (weight ratio)=1:0.47, NH$_3$:tetraethyl orthosilicate (molar ratio)=1:0.89, tetraethyl orthosilicate (molar ratio):H$_2$O=1:4.6. After that, using the microwave synthesis reactor described above, heating was performed at 60° C. for 10 minutes at 2450 MHz to perform metal oxide coating. The resulting coated semiconductor nanoparticles were sedimented by centrifugation, the supernatant was removed, toluene was added, and the particles were re-dispersed by ultrasonic irradiation. The fluorescence luminous efficiency of the resulting coated semiconductor nanoparticles was 73%, and the reduction rate of the fluorescence luminous efficiency compared to before the coating process was 3.9%.

Example 8

10 g of the 1.0 wt % InP/ZnSe/ZnS semiconductor nanoparticle toluene solution obtained in Production Example 1, 200 μL of tetraethylorthosilicate, 50 μL of a 25% aqueous ammonia solution, and 0.010 g/100 μL of the cetyltrimethylammonium bromide/ethanol solution were mixed and added to the high pressure reaction vessel. At this time, the respective mixing ratios were semiconductor nanoparticles:tetraethyl orthosilicate (weight ratio)=1:1.9, NH$_3$:tetraethyl orthosilicate (molar ratio)=1:0.89, and tetraethyl orthosilicate (molar ratio):H$_2$O=1:4.6. After that, using the microwave synthesis reactor described above, heating was performed at 60° C. for 10 minutes at 2450 MHz to perform metal oxide coating. The resulting coated semiconductor nanoparticles were sedimented by centrifugation, the supernatant was removed, toluene was added, and the particles were re-dispersed by ultrasonic irradiation. The fluorescence luminous efficiency of the resulting coated semiconductor nanoparticles was 70%, and the reduction rate of the fluorescence luminous efficiency compared to before the coating process was 7.9%.

Example 9

10 g of the 1.0 wt % InP/ZnSe/ZnS semiconductor nanoparticle toluene solution obtained in Production Example 1, 300 μL of tetraethylorthosilicate, 50 μL of a 25% aqueous ammonia solution, and 0.010 g/100 μL of the cetyltrimethylammonium bromide/ethanol solution were mixed and added to the high pressure reaction vessel. At this time, the respective mixing ratios were semiconductor nanoparticles:tetraethylorthosilicate (weight ratio)=1:2.8, NH$_3$:tetraethylorthosilicate (molar ratio)=1:0.89, and tetraethylorthosilicate (molar ratio):H$_2$O=1:4.6. After that, using the microwave synthesis reactor described above, heating was performed at 60° C. for 10 minutes at 2450 MHz to perform metal oxide coating. The resulting coated semiconductor nanoparticles were sedimented by centrifugation, the supernatant was removed, toluene was added, and the particles were re-dispersed by ultrasonic irradiation. The fluorescence luminous efficiency of the resulting coated semiconductor nanoparticles was 68%, and the reduction rate of the fluorescence luminous efficiency compared to before the coating process was 10.5%.

Example 10

10 g of the 1.0 wt % InP/ZnSe/ZnS semiconductor nanoparticle toluene solution obtained in Production Example 1, 100 μL of tetraethylorthosilicate, 25 μL of a 25% aqueous ammonia solution, and 0.010 g/100 μL of the cetyltrimethylammonium bromide/ethanol solution were mixed and added to the high pressure reaction vessel. At this time, the respective mixing ratios were semiconductor nanoparticles:tetraethyl orthosilicate (weight ratio)=1:0.94, NH$_3$:tetraethyl orthosilicate (molar ratio)=1:0.45, and tetraethyl orthosilicate (molar ratio):H$_2$O=1:2.3. After that, using the microwave synthesis reactor described above, heating was performed at 60° C. for 10 minutes at 2450 MHz to perform metal oxide coating. The resulting coated semiconductor nanoparticles were sedimented by centrifugation, the supernatant was removed, toluene was added, and the particles were re-dispersed by ultrasonic irradiation. The fluorescence luminous efficiency of the resulting coated semiconductor nanoparticles was 73%, and the reduction rate of the fluorescence luminous efficiency compared to before the coating process was 3.9%.

Example 11

10 g of the 1.0 wt % InP/ZnSe/ZnS semiconductor nanoparticle toluene solution obtained in Production Example 1, 100 μL of tetraethylorthosilicate, 100 μL of a 25% aqueous ammonia solution, and 0.010 g/1.00 μL of the cetyltrimethylammonium bromide/ethanol solution were mixed and added to the high pressure reaction vessel. At this time, the respective mixing ratios were semiconductor nanoparticles:tetraethyl orthosilicate (weight ratio)=1:0.94, NH$_3$:tetraethyl orthosilicate (molar ratio)=1:1.8, and tetraethyl orthosilicate (molar ratio):H$_2$O=1:9.2. After that, using the microwave synthesis reactor described above, heating was performed at 60° C. for 10 minutes at 2450 MHz to perform metal oxide coating. The resulting coated semiconductor nanoparticles were sedimented by centrifugation, the supernatant was removed, toluene was added, and the particles were re-dispersed by ultrasonic irradiation. The fluorescence luminous efficiency of the resulting coated semiconductor nanoparticles was 68%, and the reduction rate of the fluorescence luminous efficiency compared to before the coating process was 10.5%.

Example 12

10 g of the 1.0 wt % InP/ZnSe/ZnS semiconductor nanoparticle toluene solution obtained in Production Example 1, 100 μL of tetraethylorthosilicate, 50 μL of a 25% aqueous ammonia solution, and 0.010 g/100 μL of the cetyltrimethylammonium bromide/ethanol solution were mixed and added to the high pressure reaction vessel. The respective mixing ratios were semiconductor nanoparticles:tetraethyl orthosilicate (weight ratio)=1:0.94, NH$_3$:tetraethyl orthosilicate (molar ratio)=1:0.89, tetraethyl orthosilicate (molar ratio):H$_2$O=1:4.6. After that, using the microwave synthesis reactor, heating was performed at 40° C. for 10 minutes at 2450 MHz to perform metal oxide coating. The resulting coated semiconductor nanoparticles were sedimented by centrifugation, the supernatant was removed, toluene was added, and the particles were re-dispersed by ultrasonic irradiation. The fluorescence luminous efficiency of the resulting coated semiconductor nanoparticles was 73%, and the reduction rate of the fluorescence luminous efficiency compared to before the coating process was 3.9%.

Example 13

10 g of the 1.0 wt % InP/ZnSe/ZnS semiconductor nanoparticle toluene solution obtained in Production Example 1, 100 μL of tetraethylorthosilicate, 50 μL of a 25% aqueous ammonia solution, and 0.010 g/100 μL of the cetyltrimethylammonium bromide/ethanol solution were mixed and added to the high pressure reaction vessel. After that, using the microwave synthesis reactor described above, heating was performed at 50° C. for 10 minutes at 2450 MHz to perform metal oxide coating. The resulting coated semiconductor nanoparticles were sedimented by centrifugation, the supernatant was removed, toluene was added, and the particles were re-dispersed by ultrasonic irradiation. The fluorescence luminous efficiency of the resulting coated semiconductor nanoparticles was 72%, and the reduction rate of the fluorescence luminous efficiency compared to before the coating process was 5.3%.

Example 14

10 g of the 1.0 wt % InP/ZnSe/ZnS semiconductor nanoparticle toluene solution obtained in Production Example 1, 100 μL of tetraethylorthosilicate, 50 μL of a 25% aqueous ammonia solution, and 0.010 g/100 μL of the cetyltrimethylammonium bromide/ethanol solution were mixed and added to the high pressure reaction vessel. The respective mixing ratios were semiconductor nanoparticles: tetraethyl orthosilicate (weight ratio)=1:0.94, $NH_3$:tetraethyl orthosilicate (molar ratio)=1:0.89, tetraethyl orthosilicate (molar ratio):$H_2O$=1:4.6. After that, using the microwave synthesis reactor described above, heating was performed at 80° C. for 10 minutes at 2450 MHz to performed metal oxide coating. The resulting coated semiconductor nanoparticles were sedimented by centrifugation, the supernatant was removed, toluene was added, and the particles were re-dispersed by ultrasonic irradiation. The fluorescence luminous efficiency of the resulting coated semiconductor nanoparticles was 67%, and the reduction rate of the fluorescence luminous efficiency before the coating process was 11.8%.

Example 15

10 g of the 1.0 wt % InP/ZnSe/ZnS semiconductor nanoparticle toluene solution obtained in Production Example 1, 100 μL of tetraethylorthosilicate, 50 μL of a 25% aqueous ammonia solution, and 0.010 g/100 μL of the cetyltrimethylammonium bromide/ethanol solution were mixed and added to the high pressure reaction vessel. The respective mixing ratios were semiconductor nanoparticles: tetraethyl orthosilicate (weight ratio)=1:0.94, $NH_3$:tetraethyl orthosilicate (molar ratio)=1:0.89, tetraethyl orthosilicate (molar ratio):$H_2O$=1:4.6. After that, using the above microwave synthesis reactor described above, heating was performed at 100° C. for 10 minutes at 2450 MHz to perform metal oxide coating. The resulting coated semiconductor nanoparticles were sedimented by centrifugation, the supernatant was removed, toluene was added, and the particles were re-dispersed by ultrasonic irradiation. The fluorescence luminous efficiency of the resulting coated semiconductor nanoparticles was 62%, and the reduction rate of the fluorescence luminous efficiency before the coating process was 18.4%.

Example 16

10 g of the 1.0 wt % InP/ZnSe/ZnS semiconductor nanoparticle toluene solution obtained in Production Example 1, 100 μL of tetraethylorthosilicate, 50 μL of a 25% aqueous ammonia solution, and 0.010 g/100 μL of the cetyltrimethylammonium bromide/ethanol solution were mixed and added to the high pressure reaction vessel. The respective mixing ratios were semiconductor nanoparticles: tetraethyl orthosilicate (weight ratio)=1:0.94, $NH_3$:tetraethyl orthosilicate (molar ratio)=1:0.89, tetraethyl orthosilicate (molar ratio):$H_2O$=1:4.6. After that, using the above microwave synthesis reactor described above, heating was performed at 60° C. for 3 minutes at 2450 MHz to perform metal oxide coating. The resulting coated semiconductor nanoparticles were sedimented by centrifugation, the supernatant was removed, toluene was added, and the particles were re-dispersed by ultrasonic irradiation. The fluorescence luminous efficiency of the resulting coated semiconductor nanoparticles was 73%, and the reduction rate of the fluorescence luminous efficiency compared to before the coating process was 3.9%.

Example 17

10 g of the 1.0 wt % InP/ZnSe/ZnS semiconductor nanoparticle toluene solution obtained in Production Example 1, 100 μL of tetraethylorthosilicate, 50 μL of a 25% aqueous ammonia solution, and 0.010 g/100 Mb of the cetyltrimethylammonium bromide/ethanol solution were mixed and added to the high pressure reaction vessel. The respective mixing ratios were semiconductor nanoparticles: tetraethyl orthosilicate (weight ratio)=1:0.94, $NH_3$:tetraethyl orthosilicate (molar ratio)=1:0.89, tetraethyl orthosilicate (molar ratio):$H_2O$=1:4.6. After that, using the above microwave synthesis reactor described above, heating was performed at 2450 MHz at 60° C. for 5 minutes to perform a metal oxide coating. The resulting coated semiconductor nanoparticles were sedimented by centrifugation, the supernatant was removed, toluene was added, and the particles were re-dispersed by ultrasonic irradiation. The fluorescence luminous efficiency of the resulting coated semiconductor nanoparticles was 73%, and the reduction rate of the fluorescence luminous efficiency compared to before the coating process was 3.9%.

Example 18

10 g of the 1.0 wt % InP/ZnSe/ZnS semiconductor nanoparticle toluene solution obtained in Production Example 1, 100 μL of tetraethylorthosilicate, 50 μL of a 25% aqueous ammonia solution, and 0.010 g/100 μL of the cetyltrimethylammonium bromide/ethanol solution were mixed and added to the high pressure reaction vessel. The respective mixing ratios were semiconductor nanoparticles: tetraethyl orthosilicate (weight ratio)=1:0.94, $NH_3$:tetraethyl orthosilicate (molar ratio)=1:0.89, tetraethyl orthosilicate (molar ratio):$H_2O$=1:4.6. Then, using the microwave synthesis reactor described above, heating was performed at 60° C. for 15 minutes at 2450 MHz to perform metal oxide coating. The resulting coated semiconductor nanoparticles were sedimented by centrifugation, the supernatant was removed, toluene was added, and the particles were re-dispersed by ultrasonic irradiation. The fluorescence luminous efficiency of the resulting coated semiconductor nanoparticles was 70%, and the reduction rate of the fluorescence luminous efficiency compared to before the coating process was 7.9%.

Example 19

10 g of the 1.0 wt % InP/ZnSe/ZnS semiconductor nanoparticle toluene solution obtained in Production Example 1, 100 μL of tetraethylorthosilicate, 50 μL of a 25% aqueous ammonia solution, and 0.010 g/100 μL of the cetyltrimethylammonium bromide/ethanol solution were mixed and added to the high pressure reaction vessel. After that, using the microwave synthesis reactor described above, heating was performed at 2450 MHz at 60° C. for 20 minutes to perform metal oxide coating. The respective mixing ratios are semiconductor nanoparticles:tetraethyl orthosilicate (weight ratio)=1:0.94, NH$_3$:tetraethyl orthosilicate (molar ratio)=1:0.89, tetraethyl orthosilicate (molar ratio):H$_2$O=1:4.6. The resulting coated semiconductor nanoparticles were sedimented by centrifugation, the supernatant was removed, toluene was added, and the particles were re-dispersed by ultrasonic irradiation. The fluorescence luminous efficiency of the resulting coated semiconductor nanoparticles was 69%, and the reduction rate of the fluorescence luminous efficiency compared to before the coating process was 9.2%.

Example 20

10 g of the 1.0 wt % InP/ZnSe/ZnS semiconductor nanoparticle toluene solution obtained in Production Example 1, 100 μL of tetraethylorthosilicate, 50 μL of a 25% aqueous ammonia solution, and 0.010 g/100 μL of the cetyltrimethylammonium bromide/ethanol solution were mixed and added to the high pressure reaction vessel. After that, using the microwave synthesis reactor described above, heating was performed at 60° C. for 30 minutes at 2450 MHz to performed metal oxide coating. The respective mixing ratios were semiconductor nanoparticles:tetraethyl orthosilicate (weight ratio)=1:0.94, NH$_3$:tetraethyl orthosilicate (molar ratio)=1:0.89, tetraethyl orthosilicate (molar ratio):H$_2$O=1:4.6. The resulting coated semiconductor nanoparticles were sedimented by centrifugation, the supernatant was removed, toluene was added, and the particles were re-dispersed by ultrasonic irradiation. The fluorescence luminous efficiency of the resulting coated semiconductor nanoparticles was 67%, and the reduction rate of the fluorescence luminous efficiency before the coating process was 11.8%.

Example 21

10 g of the 1.0 wt % InP/ZnSe/ZnS semiconductor nanoparticle toluene solution obtained in Production Example 2, 100 μL of tetraethylorthosilicate, 50 μL of a 25% aqueous ammonia solution, and 0.010 g/100 μL of the cetyltrimethylammonium bromide/ethanol solution were mixed and added to the high pressure reaction vessel. The respective mixing ratios are semiconductor nanoparticles:tetraethyl orthosilicate (weight ratio)=1:0.94, NH$_3$:tetraethyl orthosilicate (molar ratio)=1:0.89, tetraethyl orthosilicate (molar ratio):H$_2$O=1:4.6, After that, using the microwave synthesis reactor described above, heating was performed at 60° C. for 10 minutes at 2450 MHz to perform metal oxide coating. The resulting coated semiconductor nanoparticles were sedimented by centrifugation, the supernatant was removed, toluene was added, and the particles were re-dispersed by ultrasonic irradiation. The fluorescence luminous efficiency of the resulting coated semiconductor nanoparticles was 74%, and the reduction rate of the fluorescence luminous efficiency compared to before the coating process was 1.3%.

Example 22

10 g of the 1.0 wt % InP/ZnSe/ZnS semiconductor nanoparticle toluene solution obtained in Production Example 3, 100 μL of tetraethylorthosilicate, 50 μL of a 25% aqueous ammonia solution, and 0.010 g/100 μL of the cetyltrimethylammonium bromide/ethanol solution were mixed and added to the high pressure reactor. The respective mixing ratios are semiconductor nanoparticles:tetraethyl orthosilicate (weight ratio)=1:0.94, NH$_3$:tetraethyl orthosilicate (molar ratio)=1:0.89, tetraethyl orthosilicate (molar ratio):H$_2$O=1:4.6. After that, using the microwave synthesis reactor described above, heating was performed at 60° C. for 10 minutes at 2450 MHz to perform metal oxide coating. The resulting coated semiconductor nanoparticles were sedimented by centrifugation, the supernatant was removed, toluene was added, and the particles were re-dispersed by ultrasonic irradiation. The fluorescence luminous efficiency of the resulting coated semiconductor nanoparticles was 73%, and the reduction rate of the fluorescence luminous efficiency before the coating process was 1.4%.

Example 23

10 g of the 1.0 wt % InP/ZnSe/ZnS semiconductor nanoparticle toluene solution obtained in Production Example 4, 100 μL of tetraethylorthosilicate, 50 μL of a 25% aqueous ammonia solution, and 0.010 g/100 μL of the cetyltrimethylammonium bromide/ethanol solution were mixed and added to the high pressure reaction vessel. The respective mixing ratios are semiconductor nanoparticles: tetraethyl orthosilicate (weight ratio)=1:0.94, NH$_3$:tetraethyl orthosilicate (molar ratio)=1:0.89, tetraethyl orthosilicate (molar ratio):H$_2$O=1:4.6. After that, using the microwave synthesis reactor described above, heating was performed at 60° C. for 10 minutes at 2450 KHz to perform metal oxide coating. The resulting coated semiconductor nanoparticles were sedimented by centrifugation, the supernatant was removed, toluene was added, and the particles were re-dispersed by ultrasonic irradiation. The fluorescence luminous efficiency of the resulting coated semiconductor nanoparticles was 74%, and the reduction rate of the fluorescence luminous efficiency compared to before the coating process was 1.3%.

Table 2 summarizes the production methods of Examples 1 to 23 described above.

TABLE 2

| | | | | Microwave irradiation condition | | | Fluorescence luminous efficiency (%) | |
| --- | --- | --- | --- | --- | --- | --- | --- | --- |
| | Semiconductor nanqparticles | Oxide precursor (amount) | Solvent (μL) | Temperature (° C.) | Time (min.) | Surfactant (amount) | After Coating | Reduction rate |
| Example 1 | Manufacturing example 1 | tetraethyl orthosilicate (100 μL) | toluene (10 g) ammonia aqueous solution (50 μL) | 60 | 10 | — | 72 | 5.3 |

TABLE 2-continued

|  | Semiconductor nanoparticles | Oxide precursor (amount) | Solvent (μL) | Microwave irradiation condition | | | Fluorescence luminous efficiency (%) | |
|---|---|---|---|---|---|---|---|---|
|  |  |  |  | Temperature (°C.) | Time (min.) | Surfactant (amount) | After Coating | Reduction rate |
| Example 2 | Manufacturing example 1 | tetraethyl orthosilicate (100 μL) | toluene (10 g) ammonia aqueous solution (50 μL) | 60 | 10 | cetyltrimethyl-ammonium bromide (0.010 g) | 70 | 7.9 |
| Example 3 | Manufacturing example 1 | tetraethyl orthosilicate (100 μL) | toluene (10 g) ammonia aqueous solution (50 μL) ethanol (100 μL) | 60 | 10 | cetyltrimethyl-ammonium bromide (0.010 g) | 70 | 7.9 |
| Example 4 | Manufacturing example 1 | aluminum isopropoxide (0.092 g) | toluene (10 g) ammonia aqueous solution (50 μL) ethanol (100 μL) | 60 | 10 | cetyltrimethyl-ammonium bromide (0.010 g) | 68 | 10.5 |
| Example 5 | Manufacturing example 1 | titanium tetrabutoxide (0.153 g) | toluene (10 g) ammonia aqueous solution (50 μL) ethanol (100 μL) | 60 | 10 | cetyltrimethyl-ammonium bromide (0.010 g) | 65 | 14.5 |
| Example 6 | Manufacturing example 1 | zirconium propoxide (0.147 g) | toluene (10 g) ammonia aeneous solution (50 μL) ethanol (100 μL) | 60 | 10 | cetyltrimethyl-ammonium bromide (0.010 g) | 67 | 11.8 |
| Example 7 | Manufacturing example 1 | tetraethyl-orthosilicate (50 μL) | toluene (10 g) ammonia aqueous solution (50 μL) ethanol (100 μL) | 60 | 10 | cetyltrimethyl-ammonium bromide (0.010 g) | 73 | 3.9 |
| Example 8 | Manufacturing example 1 | tetraethyl-orthosilicate (200 μL) | toluene (10 g) ammonia aqueous solution (50 μL) ethanol (100 μL) | 60 | 10 | cetyltrimethyl-ammonium bromide (0.010 g) | 70 | 7.9 |
| Example 9 | Manufacturing example 1 | tetraethyl-orthosilicate (300 μL) | toluene (10 g) ammonia aqueous solution (50 μL) ethanol (100 μL) | 60 | 10 | cetyltrimethyl-ammonium bromide (0.010 g) | 68 | 10.5 |
| Example 10 | Manufacturing example 1 | tetraethyl-orthosilicate (100 μL) | toluene (10 g) ammonia aqueous solution (25 μL) ethanol (100 μL) | 60 | 10 | cetyltrimethyl-ammonium bromide (0.010 g) | 73 | 3.9 |
| Example 11 | Manufacturing example 1 | tetraethyl-orthosilicate (100 μL) | toluene (10 g) ammonia aqueous solution (100 μL) ethanol (100 μL) | 60 | 10 | cetyltrimethyl-ammonium bromide (0.010 g) | 68 | 10.5 |
| Example 12 | Manufacturing example 1 | tetraethyl-orthosilicate (100 μL) | toluene (10 g) ammonia aqueous solution (50 μL) ethanol (100 μL) | 40 | 10 | cetyltrimethyl-ammonium bromide (0.010 g) | 73 | 3.9 |
| Example 13 | Manufacturing example 1 | tetraethyl-orthosilicate (100 μL) | toluene (10 g) ammonia aqueous solution (50 μL) ethanol (100 μL) | 50 | 10 | cetyltrimethyl-ammonium bromide (0.010 g) | 72 | 5.3 |
| Example 14 | Manufacturing example 1 | tetraethyl-orthosilicate (100 μL) | toluene (10 g) ammonia aqueous solution (50 μL) ethanol (100 μL) | 80 | 10 | cetyltrimethyl-ammonium bromide (0.010 g) | 67 | 11.8 |
| Example 15 | Manufacturing example 1 | tetraethyl-orthosilicate (100 μL) | toluene (10 g) ammonia aqueous solution (50 μL) ethanol (100 μL) | 100 | 10 | cetyltrimethyl-ammonium bromide (0.010 g) | 62 | 18.4 |
| Example 16 | Manufacturing example 1 | tetraethyl-orthosilicate (100 μL) | toluene (10 g) ammonia aqueous solution (50 μL) ethanol (100 μL) | 60 | 3 | cetyltrimethyl-ammonium bromide (0.010 g) | 73 | 3.9 |
| Example 17 | Manufacturing example 1 | tetraethyl-orthosilicate (100 μL) | toluene (10 g) ammonia aqueous solution (50 μL) ethanol (100 μL) | 60 | 5 | cetyltrimethyl-ammonium bromide (0.010 g) | 73 | 3.9 |
| Example 18 | Manufacturing example 1 | tetraethyl-orthosilicate (100 μL) | toluene (10 g) ammonia aqueous solution (50 μL) ethanol (100 μL) | 60 | 15 | cetyltrimethyl-ammonium bromide (0.010 g) | 70 | 7.9 |
| Example 19 | Manufacturing example 1 | tetraethyl-orthosilicate (100 μL) | toluene (10 g) ammonia aqueous solution (50 μL) ethanol (100 μL) | 60 | 20 | cetyltrimethyl-ammonium bromide (0.010 g) | 69 | 9.2 |

TABLE 2-continued

| | Semiconductor nanqparticles | Oxide precursor (amount) | Solvent (μL) | Microwave irradiation condition | | | Fluorescence luminous efficiency (%) | |
|---|---|---|---|---|---|---|---|---|
| | | | | Temperature (° C.) | Time (min.) | Surfactant (amount) | After Coating | Reduction rate |
| Example 20 | Manufacturing example 1 | tetraethyl-orthosilicate (100 μL) | toluene (10 g) ammonia aqueous solution (50 μL) ethanol (100 μL) | 60 | 30 | cetyltrimethyl-ammonium bromide (0.010 g) | 67 | 11.8 |
| Example 21 | Manufacturing example 2 | tetraethyl-orthosilicate (100 μL) | toluene (10 g) ammonia aqueous solution (50 μL) ethanol (100 μL) | 60 | 10 | cetyltrimethyl-ammonium bromide (0.010 g) | 74 | 1.3 |
| Example 22 | Manufacturing example 3 | tetraethyl-orthosilicate (100 μL) | toluene (10 g) ammonia aqueous solution (50 μL) ethanol (100 μL) | 60 | 10 | cetyltrimethyl-ammonium bromide (0.010 g) | 73 | 1.4 |
| Example 23 | Manufacturing example 4 | tetraethyl-orthosilicate (100 μL) | toluene (10 g) ammonia aqueous solution (50 μL) ethanol (100 μL) | 60 | 10 | cetyltrimethyl-ammonium bromide (0.010 g) | 74 | 1.3 |

Comparative Example 1

10 g of the 1.0 wt % InP/ZnSe/ZnS semiconductor nanoparticle toluene solution obtained in Production Example 1, 100 μL of tetraethylorthosilicate, 50 μL of a 25% aqueous ammonia solution, and 0.010 g/100 μL of the cetyltrimethylammonium bromide/ethanol solution were mixed and added to a flask. After that, the mixture was heated and stirred at 60° C. for 6 hours with a mantle heater to perform a metal oxide coating. The resulting coated semiconductor nanoparticles were sedimented by centrifugation, the supernatant was removed, toluene was added, and the particles were re-dispersed by ultrasonic irradiation. The fluorescence luminous efficiency of the resulting coated semiconductor nanoparticles was 56%, and the reduction rate of the fluorescence luminous efficiency against before the coating process was 35.7%. A significant drop in efficiency was confirmed compared with the manufacturing method using microwave irradiation treatment.

Comparative Example 2

After adding 50 mL of cyclohexane, 1.2 g of polyoxyethylene (5) nonylphenyl ether (IGEPAL-CO520 manufactured by Rhodia), and 100 μL of tetraethylorthosilicate, 5 g of the 2.0 wt % InP/ZnSe/ZnS semiconductor nanoparticle toluene solution obtained in Production Example 1 was added and stirred at room temperature of 25° C. While stirring, 1 mL of a 10% aqueous ammonia solution was added little by little, and the mixture was stirred for 48 hours to perform metal oxide coating. The resulting coated semiconductor nanoparticles were sedimented by centrifugation, the supernatant was removed, toluene was added, and the particles were re-dispersed by ultrasonic irradiation. The fluorescence luminous efficiency of the resulting coated semiconductor nanoparticles was 26%, and the decrease in fluorescence luminous efficiency against before the coating process was 65.8%. A significant drop in efficiency was confirmed compared with the manufacturing method using microwave irradiation treatment.

As described above, in Comparative Example 1, when the mantle heater was used to perform heating instead of the microwave irradiation treatment, it took a long time and the fluorescence luminous efficiency was greatly reduced. In addition, in Comparative Example 2, it took 48 hours at room temperature, which is longer than in Comparative Example 1, and the fluorescence luminous efficiency was significantly lower than in Comparative Example 1.

On the other hand, in Examples 1 to 23, which are examples of the method for producing coated semiconductor nanoparticles of the present invention, the surface of the semiconductor nanoparticles was coated with a metal oxide in a short time using microwave irradiation treatment. It was confirmed that coated semiconductor nanoparticles exhibiting high fluorescence luminous efficiency were produced efficiently by suppressing deterioration of fluorescence luminous efficiency in the coating process.

(Producing Method of Wavelength Conversion Material)

The coated semiconductor nanoparticles obtained in Examples 1 to 23 and Comparative Examples 1 and 2 and the semiconductor nanoparticles obtained in Production Example 1 were used without, coating as Comparative Example 3, and the wavelength conversion material was prepared. 1.0 g of a 1.0 wt; % toluene solution of the above semiconductor nanoparticles or coated semiconductor nanoparticles was mixed with 10.0 g of a silicone resin (LPS-5547 manufactured by Shin-Etsu Chemical Co., Ltd.) and stirred while heating at 60° C. and solvent removal was performed under reduced pressure. After that, vacuum degassing was performed, the composition was applied onto a polyethylene terephthalate (PET) film having a thickness of 50 μm, and a semiconductor nanoparticle resin layer having a thickness of 100 μm was formed using a bar coater. Furthermore, a PET film was pasted and laminated on this resin layer. This film was heated at 60° C. for 2 hours and then at 150° C. for 4 hours to cure the semiconductor nanoparticle resin layer, thereby producing a wavelength conversion material.

The obtained wavelength conversion material was treated under conditions of 85° C. and 85% RH (relative humidity) for 100 hours, and the reliability was evaluated by measuring the fluorescence luminous efficiency of the treated wavelength conversion material. Table 3 shows the fluorescence luminous efficiency after the production of the wavelength conversion material and the fluorescence luminous efficiency after the reliability evaluation.

TABLE 31

| Coated semiconductor nanoparticles or semiconductor nanoparticles | Fluorescence luminous efficiency of wavelength conversion material (%) after production | Fluorescence luminous efficiency of wavelength conversion material (%) after reliability evaluation |
|---|---|---|
| Example 1 | 34 | 27 |
| Example 2 | 33 | 28 |
| Example 3 | 33 | 28 |
| Example 4 | 30 | 24 |
| Example 5 | 27 | 21 |
| Example 6 | 29 | 23 |
| Example 7 | 36 | 24 |
| Example 8 | 32 | 27 |
| Example 9 | 30 | 25 |
| Example 10 | 34 | 21 |
| Example 11 | 29 | 22 |
| Example 12 | 35 | 25 |
| Example 13 | 34 | 26 |
| Example 14 | 29 | 22 |
| Example 15 | 27 | 20 |
| Example 16 | 34 | 26 |
| Example 17 | 33 | 28 |
| Example 18 | 31 | 26 |
| Example 19 | 30 | 25 |
| Example 20 | 28 | 23 |
| Example 21 | 35 | 29 |
| Example 22 | 35 | 29 |
| Example 23 | 36 | 30 |
| Comparative Example 1 | 24 | 17 |
| Comparative Example 2 | 13 | 9 |
| Comparative Example 3 | 37 | 17 |

From the results of Table 3, the fluorescence luminous efficiency of the wavelength conversion material after reliability evaluation was 17% for Comparative Example 1, 9% for Comparative Example 2, and 17% for Comparative Example 3. All the Comparative Examples resulted in less than 20%.

On the other hand, the coated semiconductor nanoparticles (Examples 1 to 23) produced by the method for producing coated semiconductor nanoparticles of the present invention had a fluorescence luminous efficiency of 20% or more after reliability evaluation. As described above, the coated semiconductor nanoparticles produced by the method for producing coated semiconductor nanoparticles of the present invention exhibit high stability, and wavelength conversion materials using the same exhibit suppressed deterioration in fluorescence luminous efficiency under high temperature and high humidity conditions and confirmed to be highly reliable. As described above, the coated semiconductor nanoparticles produced by the method for producing coated semiconductor nanoparticles of the present invention have better physical properties than conventional products, and are clearly different from conventional products.

The present invention is not limited to the above-described embodiments. The above-described embodiments are just examples, and any examples having substantially the same configuration as the technical idea described in the claims of the present invention and exhibiting the same effects are included is the technical scope of the present invention.

The invention claimed is:

1. A method for producing coated semiconductor nanoparticles, comprising a step of coating the surface of semiconductor nanoparticles with a metal oxide, wherein the semiconductor nanoparticles used in the coating step are comprised of a semiconductor nanoparticle core and one or more semiconductor nanoparticle shells covering the semiconductor nanoparticle core, and
wherein the surface of the semiconductor nanoparticles is coated with the metal oxide by treating a metal oxide precursor with microwave irradiation treatment.

2. The method for producing coated semiconductor nanoparticles according to claim 1, wherein the coating step is performed under the coexistence of the semiconductor nanoparticles and the metal oxide precursor, and the metal oxide precursor under the coexistence is subjected to the microwave irradiation treatment, so that the surface of the semiconductor nanoparticles is coated with the metal oxide.

3. The method for producing coated semiconductor nanoparticles according to claim 1, wherein the semiconductor nanoparticle core used in the coating step is selected as single, multiple, alloy, or mixed crystal, from the group consisting of ZnS, ZnSe, ZnTe, CdS, CdSe, CdTe, AlN, AlP, AlAs, AlSb, GaN, GaP, GaAs, GaSb, InN, InP, InAs, InSb, $AgGaS_2$, $AgInS_2$, $AgGaSe_2$, $AgInSe_2$, $CuGaS_2$, $CuGaSe_2$, $CuInS_2$, $CuInS_2$, $ZnSiP_2$, $ZnGeP_2$, $CdSiP_2$ and $CdGeP_2$.

4. The method for producing coated semiconductor nanoparticles according to claim 1, wherein the semiconductor nanoparticle shell used in the coating step is selected as single, multiple, alloy, or mixed crystal, from the group consisting of ZnS, ZnSe, ZnTe, CdS, CdSe, CdTe, AlN, AlP, AlAs, AlSb, GaN, GaP, GaAs, GaSb, InN, InP, InAs, InSb.

5. The method for producing coated semiconductor nanoparticles according to claim 1, wherein the coating step is performed in one or more solvents selected from the group consisting of a polar solvent, a nonpolar solvent, and an ionic liquid.

6. The method for producing coated semiconductor nanoparticles according to claim 5, wherein the solvent used in the coating step contains at least 90% by volume of the nonpolar solvent.

7. The method for producing coated semiconductor nanoparticles according to claim 5, wherein the nonpolar solvent used in the coating step is selected from the group consisting of one or more of toluene, hexane, cyclohexane, benzene, and diethyl ether.

8. The method for producing coated semiconductor nanoparticles according to claim 1, wherein the metal oxide precursor used in the coating step is one or more selected from the group consisting of metal alkoxides, metal halides, and metal complexes.

9. The method for producing coated semiconductor nanoparticles according to claim 1, wherein the coating step is performed in the presence of an alkaline aqueous solution.

10. The method for producing coated semiconductor nanoparticles according to claim 1, wherein the coating step is performed in the presence of a surfactant.

11. The method for producing coated semiconductor nanoparticles according to claim 1, wherein the coating step is performed in the presence of alcohol.

12. The method for producing coated semiconductor nanoparticles according to claim 1, wherein the treatment time of the microwave irradiation treatment in the coating step is in a range of 3 to 30 minutes.

13. The method for producing coated semiconductor nanoparticles according to claim 1, wherein the heating temperature of the microwave irradiation treatment in the coating step is in a range of 40 to 100° C.

14. The method for producing coated semiconductor nanoparticles according to claim 1, wherein the method further comprises modifying the surface of the semiconductor nanoparticles with a surface modifier before the coating step.

15. The method for producing coated semiconductor nanoparticles according to claim 14, wherein the surface modifier is one or more selected from the group consisting of (3-aminopropyl) trimethoxysilane, (3-aminopropyl) triethoxysilane, (3-mercaptopropyl) trimethoxysilane, (3-mercaptopropyl) triethoxysilane, 6-mercapto-1-hexanol, mercaptoacetic acid, 3-mercaptopropionic acid, and 4-mercaptobenzoic acid.

* * * * *